United States Patent
Wang et al.

(10) Patent No.: US 7,229,662 B2
(45) Date of Patent: Jun. 12, 2007

(54) HETEROLAYERED FERROELECTRIC THIN FILMS AND METHODS OF FORMING SAME

(75) Inventors: John Wang, Singapore (SG); Anthony Zhaohui Zhou, Singapore (SG); Junmin Xue, Singapore (SG)

(73) Assignee: National University of Singapore, Singapore (SG)

( * ) Notice: Subject to any disclaimer, the term of this patent is extended or adjusted under 35 U.S.C. 154(b) by 325 days.

(21) Appl. No.: 10/738,715

(22) Filed: Dec. 16, 2003

(65) Prior Publication Data
US 2005/0128675 A1 Jun. 16, 2005

(51) Int. Cl.
*B05D 1/38* (2006.01)

(52) U.S. Cl. ............... 427/100; 427/126.3; 427/240; 427/376.2; 427/380; 427/419.3

(58) Field of Classification Search ............... 427/240, 427/419.3, 419.2, 379, 380, 376.2, 100, 126.3
See application file for complete search history.

(56) References Cited

U.S. PATENT DOCUMENTS

| | | | |
|---|---|---|---|
| 4,749,900 A | 6/1988 | Hadimioglu et al. | 310/334 |
| 5,913,117 A | 6/1999 | Lee | 438/240 |
| 6,440,210 B1 | 8/2002 | Bruchhaus et al. | 117/4 |
| 2002/0127335 A1 | 9/2002 | Lee et al. | 427/240 |
| 2002/0185935 A1 | 12/2002 | Yamamoto et al. | 310/328 |
| 2003/0080329 A1* | 5/2003 | Kurasawa et al. | 257/3 |

FOREIGN PATENT DOCUMENTS

| EP | 1 308 990 A2 | 7/2003 |
|---|---|---|
| WO | WO 90/12755 A1 * | 11/1990 |
| WO | WO 90/13149 | 11/1990 |
| WO | WO 01/67465 A2 | 9/2001 |

OTHER PUBLICATIONS

Applied Physics Letters, vol. 82(26), pp. 4761-4763, Large remanent polarization of 100% polar-axis-oriented epitaxial tetragonal Pb(Zr$_{035}$ Ti$_{065}$)O$_3$ T thin films [L].
Q. Zou, H.E. Ruda and B.G. Yacobi, Applied Physics letters, 78, 2001. (p. 1282).
C.H. Lin, P.A. Friddle, C.H. Ma, A. Daga, and H. Chen, Journal of Applied Physics, 90, 2001, p. 1509.
T. Kumazama, Y. Kumagai, H. Miura, and M. Kitano, Applied Physics Letters, 72, 1998.
O. Lohse, M. Grossmann, U. Boettger, and D. Bolten, Journal of Applied Physics, 89, 2001.
Y. Sakashita, T. Ono, H. Segawa, K. Tominaga and M. Okada, Journal of Applied Physics, 69, 1991.
I. Kanno, S. Hayashi, R. Takayama and T. Hirao, Applied Physics Letters, 68, 1996.

* cited by examiner

*Primary Examiner*—Kirsten Jolley
(74) *Attorney, Agent, or Firm*—Klarquist Sparkman, LLP

(57) ABSTRACT

Heterolayered thin films having ferroelectric/piezoelectric layers of alternating crystal structures and methods of their preparation are provided. In the ferroelectric/piezoelectric thin film, a first layer has a rhombohedral crystal structure and a second layer adjacent the first layer has a tetragonal crystal structure. The layers have a (100) preferred orientation with α-axis normal to the surface of the film. The first layer can be a Zr-rich lead ziroconate titanate layer (e.g., PbZr$_{0.8}$Ti$_{0.2}$O$_3$) and the second layer can be a Ti-rich PZT layer (e.g., PbZr$_{0.2}$Ti$_{0.8}$O$_3$). Heterolayered ferroelectric/piezoelectric thin film comprising a plurality of such first and second layers in alternating sequence exhibits particularly improved electrical properties.

24 Claims, 9 Drawing Sheets

HETEROLAYERED FERROELECTRIC THIN FILMS AND METHODS OF FORMING SAME

FIELD OF INVENTION

The present invention relates to heterolayered ferroelectric/piezoelectric thin films and the methods of forming the same.

BACKGROUND

Lead-zirconate-titanate (PZT) thin films are technologically important and useful due to their excellent ferroelectric and piezoelectric properties. They exhibit large piezoelectric coefficients, large polarizations and desirable dielectric permittivity. Therefore, PZT thin films are employed in a wide variety of technologically demanding applications such as in microelectromechanical systems, dynamic random access memories, and non-volatile ferroelectric random access memories.

The crystal structures and hence the ferroelectric and piezoelectric behaviours of a PZT film (i.e., $Pb(Zr_xTi_{(1-x)})O_3$) are dependent on the stoichiometric ratio of Zr/Ti in the film (i.e., x/(1-x), hereinafter referred to as Zr/Ti ratio) (B. Jaffe, W. R. Cook and H. Jaffe, Piezoelectric Ceramics, New York, Academic, 1971). They also vary with temperature. For example, at room temperature, PZT of a low Zr/Ti ratio is tetragonal in structure while that of a high Zr/Ti ratio is orthorhombic or rhomobohedral, depending on the value of the Zr/Ti ratio. The ferroelectric and piezoelectric properties of PZT thin films are also dependent on the film texture and orientation.

Several processing techniques have been used to form PZT films, including pulsed laser deposition, chemical vapour deposition, radio frequency (RF) sputtering, sol-gel processing, and other chemistry-based processing techniques. Among these techniques, sol-gel processing provides flexibility in controlling the film texture and thickness, and is also relatively inexpensive.

In a typical sol-gel process for PZT thin films, a precursor solution is prepared and then spin-coated on a suitable substrate, such as silicon wafer or other ceramic substrates of either single crystal or polycrystal or metal substrates. The precursor film is then baked and annealed at high temperatures to form a crystallized PZT layer on the substrate. The structure and properties of the resulting PZT thin films can be varied to a certain extent by using different substrate materials. For instance, PZT film can grow epitaxially from a single crystal substrate, which often dictates the growth orientation of the PZT film. Several different dopants have also been added to PZT thin films, in order to tailor their structure and electrical properties.

The electrical properties of PZT thin films can be further improved by depositing PZT layer on a specifically designed functional layer. For example, it has been shown that depositing a PZT layer with a $LaNiO_3$ buffer layer on metal substrates can improve dielectric properties of PZT thin film (Q. Zou, H. E. Ruda and B. G. Yacobi, Appl. Phys. Lett.; 78, 2001, p1282).

While conventional PZT films exhibit good electrical properties and can be prepared by several existing techniques, there is a need for developing novel ferroelectric/piezoelectric thin films that have improved properties and methods for forming the same.

SUMMARY OF THE INVENTION

The invention provides a heterolayered ferroelectric/piezoelectric thin film with improved electrical properties. The heterolayered thin film has at least two different layers of ferroelectric materials, such as PZT layers of two different compositions, adjacent to each other wherein one of the layers has a rhombohedral crystal structure and the other has a tetragonal crystal structure and the layers exhibit a preferred orientation normal to the film surface. The heterolayered thin film can be highly oriented with a strong (100) film texture.

In one aspect the invention therefore provides a heterolayered thin film having a generally flat surface, comprising a first ferroelectric/piezoelectric layer having a rhombohedral crystal structure; a second ferroelectric/piezoelectric layer adjacent said first layer and having a tetragonal crystal structure. The first and second layers have a preferred orientation with α-axis normal to said surface.

In other aspects the invention provides methods of preparing a heterolayered thin film and films when made by methods of the invention. In one aspect, the invention provides a method of forming a heterolayered thin film comprising: a. forming a first precursor layer capable of being crystallized into a rhombohedral structure of a ferroelectric/piezoelectric material; b. baking said first precursor layer; c. forming a second precursor layer capable of being crystallized into a tetragonal structure of a second ferroelectric/piezoelectric material on said first precursor layer; d. baking said second precursor layer at a temperature sufficient to crystallize the second precursor layer; e. annealing said first and second precursor layers to form a crystallized film.

In some embodiments, the film is a PZT film and the invention also provides a method of forming a heterolayered lead ziroconate titanate (PZT) film, comprising: a. forming a first precursor layer containing PZT having a chemical formula of $PbZr_xTi_{(1-x)}O_3$, wherein 0.52<x<0.9; b. baking said first precursor layer; c. forming on said first precursor layer, a second precursor layer containing PZT having a chemical formula of $PbZr_yTi_{(1-y)}O_3$, wherein 0<y<0.52; d. baking said second precursor layer at a temperature sufficient to crystallize the second precursor layer; e. annealing said first and second precursor layers to form a crystallized film.

Advantageously and preferably, steps (a) to (d) are repeated to form a heterolayered ferroelectric/piezoelectric film with more than two layers of alternating crystal structures.

Other novel aspects, features and advantages of the invention will become apparent to those of ordinary skill in the art upon review of the following description of specific embodiments of the invention in conjunction with the accompanying figures.

BRIEF DESCRIPTION OF THE DRAWINGS

In the figures, which illustrate exemplary embodiments of the invention.

DETAILED DESCRIPTION OF THE INVENTION

Figure 1:
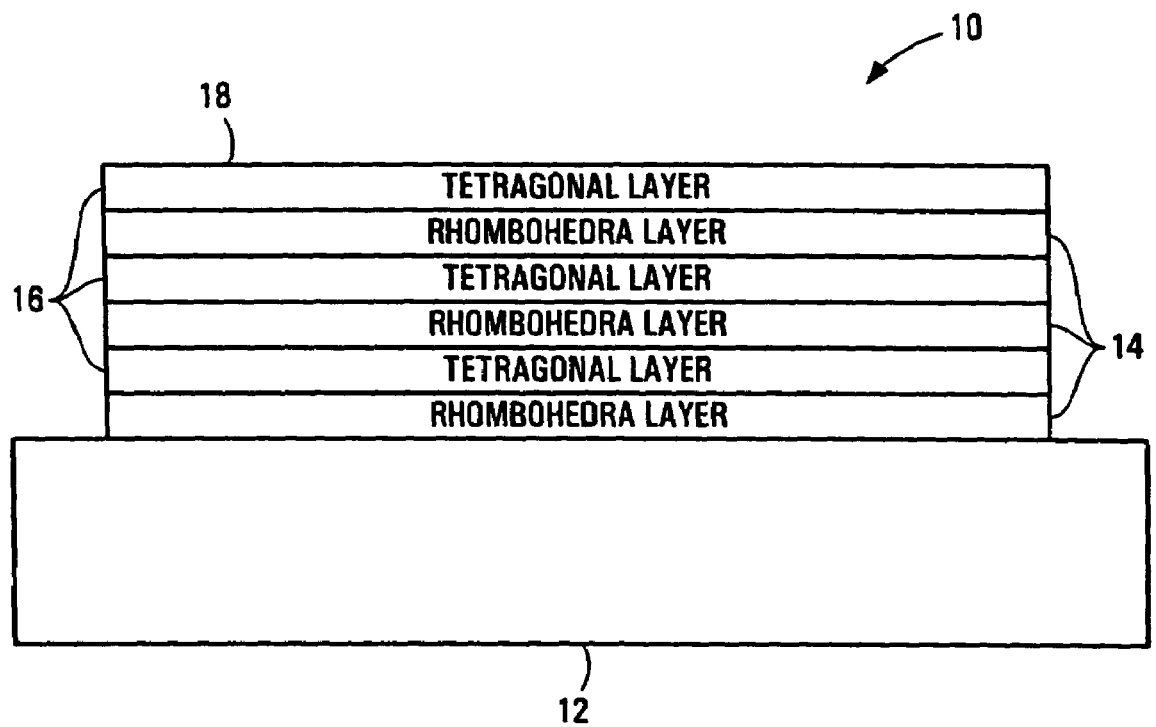
FIG. 1 is a side view of a heterolayered thin film formed on a substrate.

FIG. 1 (not to scale) illustrates a heterolayered thin film 10 formed on a substrate 12. Film 10 has a generally flat surface 18. Film 10 has six layers of ferroelectric/piezoelectric materials (the term "ferroelectric/piezoelectric" materials is used to describe materials that have ferroelectric and piezoelectric properties) with alternating crystal structures, i.e. each pair of adjacent layers have different crystal structures. Layers 14 are rhombohedral and layers 16 are tetragonal. The crystal structures of film 10 are strongly textured with a preferred orientation with α-axis normal to the film surface 18 (known as the (100) preferred orientation). The term "preferred orientation" describes any detectable preferred crystal growth in certain direction, for example, as determined by method described in the Examples.

While six layers are depicted in FIG. 1, film 10 may have less or more layers and the layers may be differently arranged, so long as film 10 has at least two alternating layers: one tetragonal layer 16 adjacent to a rhombohedral layer 14. However, as will be shown below, films having more (e.g. six layers) alternating layers exhibit particularly advantageous properties.

As depicted, the layer adjacent to substrate 12 is a rhombohedral layer 14. Optionally, a tetragonal layer 16 may be adjacent to the substrate. However, having a rhombohedral layer 14 adjacent substrate 12 can be advantageous because it facilitates the (100) preferred orientation.

Suitable ferroelectric/piezoelectric materials include lead-zirconate-titanate ($Pb(Zr,Ti)O_3$) (PZT). For example, a rhombohedral layer 14 may be a Zr-rich PZT layer while a tetragonal layer 16 may be a Ti-rich PZT layer. As the term is used herein, Zr-rich PZT refers to PZT having the chemical formula $PbZr_xTi_{(1-x)}O_3$, where $0.52<x<0.9$, and Ti-rich PZT refers to PZT having the chemical formula $PbZr_yTi_{(1-y)}O_3$, where $0<y<0.52$. As is known, at room temperature, the crystal structures of a Ti-rich PZT are tetragonal and the crystal structures of a Zr-rich PZT are rhombohedral. While the values of x and y may vary, the inventors have found that when x=0.8 and y=0.2 the heterolayered PZT thin films formed exhibit particularly strong (100) preferred orientation. As is understood, when a PZT composition has a high Zr content (i.e., $0.9<x<1$) it exhibits an orthorhombic structure and is thus not suitable for use in either layers 14 or layers 16.

Other similar ferroelectric/piezoelectric materials, such as $Pb((Mg,Nb)O_3$, for example $Pb(Mg_{1/3}Nb_{2/3})O_3$, $Pb(Zn,Nb)O_3—PbTiO_3$, for example $Pb(Zn_{1/3}Nb_{2/3})O_3—PbTiO_3$, and $Pb(Mg,Nb)O_3—PbTiO_3$, for example $Pb(Mg_{1/3}Nb_{2/3})O_3—PbTiO_3$, may also be used to form layers 14 or 16.

Layers 14 and 16 may have the same or different thickness. The thickness of each layer 14 or 16 may vary, for example, in the range of a few to a few hundred of nanometers.

Substrate 12 can be any suitable substrate known to a person skilled in the art. For example, substrate 12 can be silicon. The surface of the substrate can be pre-treated. For example, it may be advantageous to use a Pt-passivated silicon wafer. A thin Pt layer (e.g., ~100 nm in thickness) can be deposited on the silicon surface as bottom electrode. Further, a thin Ti layer of ~50 nm thickness may also be deposited on the surface to provide an adhesion layer below the Pt layer. A thin layer of $SiO_2$ (~100 nm in thickness) may also be formed between the Ti layer and the silicon surface to prevent diffusion of metal and enhance the adhesion. Other possible substitutes can be metals, glasses or ceramics, such as $Al_2O_3$, MgO and $SrTiO_3$, in either single crystal or polycrystalline form. Suitable metal substrates include brass, platinum, titanium, stainless steel, and the like.

To provide good adhesion with the film and proper surface finish, the surface of substrate 12 may need to be cleaned. As can be appreciated, film orientation and the resulting film properties may be affected by the surface chemistry, morphology and mechanical properties. Thus the choice of a proper substrate should be made taking these factors into account. A skilled person can readily determine the suitable substrates and their surface properties.

As will be described in more detail below, the inventors have discovered that heterolayered thin film 10 exhibits excellent ferroelectric and dielectric properties, such as a high remanent polarization, and high dielectric coefficient/constant, in comparison with conventional ferroelectric thin films such as conventional PZT films.

Without being limited to any particular theory, the enhancement in polarization in heterolayered film 10 is believed to be due to the field-induced stresses and the coupling effects among the layers of different crystal structures. As is known, the lattice constants of α-axis and c-axis in tetragonal structures of some ferroelectric materials such as Ti-rich PZT are only slightly different. When an electrical field is applied in a direction normal to the film surface, a strain is induced in the rhombohedral layer (such as a Zr-rich PZT layer) due to piezoelectric effect. This strain in turn causes a compressive stress along the surface of the adjacent tetragonal layer. If the tetragonal layer (i.e., Ti-rich PZT layer) is (100) orientated with the α-axis normal to the film surface and the c-axis parallel to the surface and a compressive stress is induced along the surface, the α- and c-axes can swap directions with each other through tiny displacement of atoms within the unit cells under the compressive stress, because the difference in the lattice constants is small. The reoriented unit cells will have their c-axis directed normal to the layer/film surface. This reorientation of domains thus results in an increased polarization in the heterolayered thin film because the polarization direction in the tetragonal layer is along the c-axis.

As can now be appreciated, it is unnecessary to use the same ferroelectric/piezoelectric material, such as PZT, for all of layers 14 and 16. Layers 14 and 16 may include both PZT and non-PZT layers. For example, all of the tetragonal layers 16 may be made of PZT and all of the rhombohedral layers 14 may be made of a non-PZT material. However, when two or more different layer materials are used, the materials should be chosen so that they have compatible crystal structures and properties so that desirable interaction and couplings between adjacent layers will occur to achieve the (100) preferred orientation and preferably enhanced polarization. In this regard, using the same material, such as PZT of different compositions, for both layers 14 and 16 can be advantageous.

Heterolayered thin film such as film 10 can be formed in the following exemplary process. The tetragonal and rhombohedral precursor layers are sequentially formed in alternating sequence. For example, a rhombohedral precursor layer can be formed on a substrate and a tetragonal precursor layer formed thereon. More specifically, a heterolayered film can be formed by forming a precursor layer with a ferroelectric/piezoelectric material capable of being crystallized into a rhombohedral structure and adjacent this layer, forming a precursor layer with a second ferroelectric material capable of being crystallized into a tetragonal structure. The first layer is baked before forming the other layer. One of the precursor layers may contain Zr-rich PZT and the other may contain Ti-rich PZT. Additional precursor layers may advantageously be formed to further improve the ferroelectric properties of the resulting film. The layers are annealed to form a crystallised film.

Figure 2:
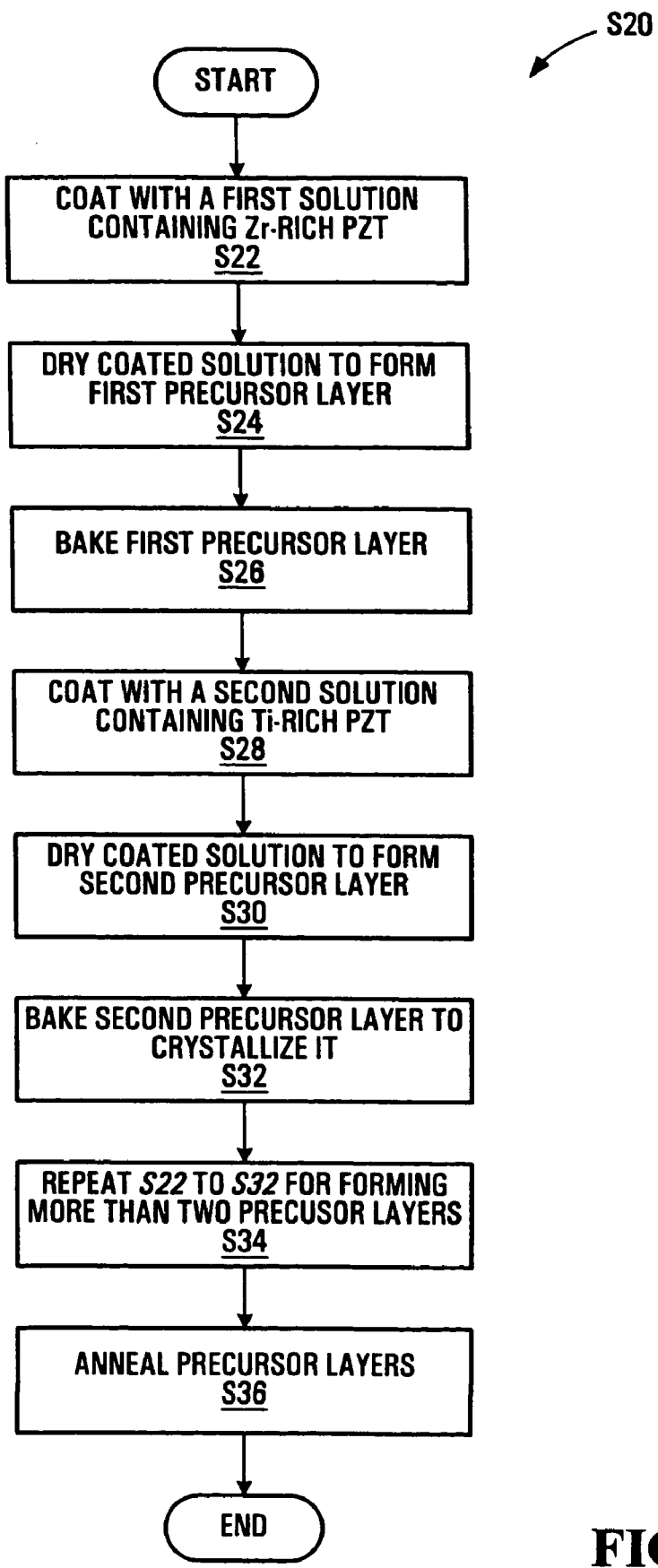
FIG. 2 is a block diagram illustrating a process for forming a heterolayered PZT thin film.

To further illustrate, an exemplary process S20 for forming a heterolayered PZT thin film is described below with reference to FIG. 2. As will become more apparent below, process S20 can be employed to form heterolayered thin films with more than two alternating layers.

At S22, a first PZT precursor solution containing Zr-rich PZT is coated on a substrate. Zr-rich PZT has the formula $PbZr_xTi_{(1-x)}O_3$, where $0.52<x<0.9$. As discussed herein, forming a rhombohedral layer as the initial layer (meaning the layer adjacent the substrate) can be advantageous as it facilitates the desired orientation of the resulting film. A suitable substrate is a Pt-passivated silicon wafer. The initial precursor solution may contain Ti-rich PZT instead of Zr-rich PZT. However, the inventors have found that the preferred orientation can be significantly weakened if Ti-rich PZT layer is the initial layer. As such, an additional layer between the substrate and Ti-rich PZT layer, which facilitates the formation of the preferred orientation, may be necessary.

The precursor solution may be a sol solution and can be obtained by mixing different component precursor solutions. For example, appropriate amounts of lead acetate [$Pb(CH_3COO)_2.3H_2O$] (as the lead precursor), zirconium propoxide ($Zr[OCH(CH_3)_2]_4$) (as the zirconium precursor) and titanium isopropoxide ($Ti[OCH(CH_3)_2]_4$) (as the titanium precursor) may be dissolved in a suitable solvent such as a mixture of ethylene glycol monomethyl ether ($C_3H_8O_2$) and acetic acid. The volume ratio of ethylene glycol monomethyl ether over acetic acid may be in the range from 2 to 6. The PZT precursor solution may also be prepared in other suitable manners known to a person skilled in the art.

The required concentration of each of lead acetate, zirconium propoxide and titanium isopropoxide in the precursor solution can be calculated from the desired stoichiometric composition of the resulting PZT layer. These calculations can be readily carried out by a person skilled in the art. For example, for forming a layer containing $PbZr_{0.8}Ti_{0.2}O_3$ (referred to as $PZ_{80}T_{20}$), the concentration ratio of Zr and Ti in the final solution should be 4 to 1. If the layer is to contain $PbZr_{0.2}Ti_{0.8}O_3$ (referred to as $PZ_{20}T_{80}$), the Zr to Ti concentration ratio should be 1 to 4. However, since lead can be lost during heat treatment, up to about 10 mol % excessive lead can be added to compensate for the expected loss. The amount of excessive lead may be calculated based on the amount of lead calculated from the desired PZT composition in the layer to be formed.

To prepare the PZT sol solution, $Pb(CH_3COO)_2.3H_2O$ may be first added into the solvent. The solution may then be heated to and maintained at a temperature in the range from about 105° C. to 120° C. for 10 to 30 minutes in order to dissolve $Pb(CH_3COO)_2.3H_2O$ and remove $H_2O$ from the solution. Similarly, zirconium and titanium precursor solutions can be prepared by dissolving $Zr[OCH(CH_3)_2]_4$ and $Ti[OCH(CH_3)_2]_4$ into separate solvents. The three solutions can be subsequently mixed together, followed by stirring for a time period in the range of, for example, about 1 to 4 hours. The concentration of the PZT compound (e.g. $PZ_{80}T_{20}$ or $PZ_{20}T_{80}$) in the mixture can be controlled. In some embodiments, PZT concentrations in the range of 0.2 to 0.6 M have been found to produce the most desirable results.

The solution may be coated on the substrate in any suitable manner, such as by spin-coating. Spin-coating is advantageous because it provides better control of the film texture and subsequent processes, such as hydrolysis and condensation, as well as the thickness and uniformity of the film. The speed and duration of spin-coating may be determined based on factors known to persons skilled in the art, such as the desired film thickness and uniformity. For example, it has been found that in some embodiments, spin-coating at a speed in the range of about 2000 to 5000 rpm for a period of about 20 to 50 seconds produced desirable film thickness and uniformity. However, these and other operating parameters may vary and may depend on the particular application as can be understood by persons skilled in the art.

At S24, the coated precursor solution is dried to form a first PZT precursor layer in manners known to a person skilled in the art. The precursor layer may be dried for example by heating to and maintaining at a temperature between about 250° C. to about 350° C. for about 5 to 20 minutes. Drying is necessary to eliminate most of the solvent.

At S26, the precursor layer is then baked, for example by heating to and maintaining at a temperature of about 500° C. for about 10 to 30 minutes. As will be understood, baking causes many organic compounds in the layer to decompose and stablizes the baked layer.

At S28, a second PZT precursor solution containing Ti-rich PZT ($PbZr_yTi_{(1-y)}O_3$, where $0<y<0.52$) is coated on the dried, and baked, first precursor layer. The second PZT precursor solution can be similarly prepared and coated as at S22.

The second precursor solution coated on the first precursor layer is dried to form a second PZT precursor layer (at S30) and then baked (at S32) in a similar manner as at S24 and S26. Optionally, the temperatures and durations may vary from those at S24 and S26.

It is advantageous to bake each precursor layer before coating another precursor layer thereon because a baked layer is less likely to crack when the subsequent layers are coated. Further, baking each precursor layer individually can minimize diffusion between the precursor layers. Diffusion between layers can significantly affect the electric properties of the resulting heterolayered film.

The baking temperature should be sufficiently high to crystallise Ti-rich PZT precursor layer. Further, it is advantageous to bake at a temperature low enough so as not to crystallize the Zr-rich layer until the annealing step, because the amorphous Zr-rich layer can serve as a buffer or seeding layer facilitating the preferred orientation of Ti-rich PZT layer. Experimental results show that the baking temperature in some embodiments may vary between about 480° C. and 510° C. but baking at about 500° C. produced the best result.

Steps S22 to S32 may be repeated, using the same two precursor solutions or different precursor solutions, to form thin films of more than two alternating layers. The inventors have observed better film properties when there are more than two layers, for example when there are four and six layers.

At S36, the PZT precursor layers formed in the preceding steps are annealed to form PZT film with stable, desired crystal structures and the preferred (100) orientation. The precursor layers can be annealed at a temperature between about 600° C. to about 750° C. for about 0.5 to 2 hours. As can be appreciated, the annealing temperature should be high enough to crystallize the PZT layers in desired structures and orientations. However, too high a temperature may cause significant loss of lead, cracking of films, and formation of undesirable pyrochlore phases and should be avoided. Optionally, each pair of adjacent layers can be annealed before additional layers are coated by repeating steps S22 to S32 and S36. However, annealing all of the precursor layers together may have advantages such as reduced number of heating cycles, reduced lead loss and improved surface texture.

In a specific embodiment, the first precursor solution contains $PZ_{20}T_{80}$ and the second precursor solution contains $PZ_{80}T_{20}$. X-ray Diffraction (XRD) phase analyses showed that $PZ_{20}T_{80}$ layers can be crystallized at a temperature of about 480° C., while $PZ_{80}T_{20}$ layers remain amorphous at temperatures as high as 500° C. Without being limited to a particular theory, the reason for the difference in crystallization temperature lie in the differences in reactivity and affinity of lead oxide with zirconium and titanium, which affect the crystallization behaviours of PZT with different Zr/Ti ratios. Regardless, because $PZ_{80}T_{20}$ only crystallizes at relatively high temperatures, at relatively low temperatures the $PZ_{80}T_{20}$ layer is amorphous and can serve as a buffer layer and/or a seeding layer, facilitating the formation of (100) preferred orientation of crystal structure in the $PZ_{20}T_{80}$ layers. This is especially so by considering that PZT tends to self-texture into the (100) orientation because this orientation has the lowest surface energy. When annealed at a temperature in the range from about 600° C. to 750° C. as described above, the occurrence of such (100) preferred orientation in the $PZ_{20}T_{80}$ layer facilitates crystallization of the adjacent $PZ_{80}T_{20}$ layer into the same (100) orientation, due to coupling between adjacent layers.

In this embodiment, as now can be appreciated, to obtain a strong (100) orientation in the heterolayered PZT film, the PZT layers need to be baked at a temperature of about 500° C. before they are annealed. Experiments have shown that when a heterolayered PZT film was baked at temperatures below 450° C., i.e., below the crystallization temperatures of both $PZ_{80}T_{20}$ and $PZ_{20}T_{80}$, no preferred orientation was observable with XRD. When the baking temperature was raised to 500° C., the peak intensity ratio of (001)/(101) for $PZ_{80}T_{20}$ layers increased from 0.16 to 2.89, while the peak intensity ratio of (100)/(110) for $PZ_{20}T_{80}$ layers increased from 0.45 to 5.65. Thus, baking temperature can be critical in obtaining a desired film orientation or texture in the resulting thin film, and should be precisely controlled for obtaining a desirable film orientation.

Heterolayered PZT films formed according to the exemplary process described herein exhibit excellent film characteristics, including high crystallinity, dense inter-layer structure, large remanent polarization in comparison with conventional PZT films, and high dielectric constant, and are further described and exemplified in the following examples with reference to the accompanying drawings.

EXAMPLE 1

A two-heterolayered PZT thin film was formed as follows:

Step 1. 50 ml of 0.4 M precursor solution of $PbZr_{0.8}Ti_{0.2}O_3$ was prepared by:
  dissolving an appropriate amount of $Pb(CH_3COO)_2 \cdot 3H_2O$ (7.963 g, calculated from the desired concentration and volume of the final solution mixture as well as the stoichiometry of the organic solvents and the composition of $PZ_{80}T_{20}$) into 10 ml of a solvent, which was a mixture of ethylene glycol monomethyl ether ($C_3H_8O_2$) and acetic acid at a volume ratio of 5/1.3 at 110° C.
  dissolving appropriate amounts of $Zr[OCH(CH_3)_2]_4$ and $Ti[OCH(CH_3)_2]_4$ (5.241 g and 1.137 g), respectively, in two 5 ml of the same solvent.
  mixing the above three solutions together, with the total volume of the mixed solution brought up to 50 ml by adding additional solvent.
  stirring the mixed solution for 2 hours.

Step 2. 50 ml of 0.4 M precursor solution of $PbZr_{0.2}Ti_{0.8}O_3$ was prepared similarly, but with the amounts of $Pb(CH_3COO)_2 \cdot 3H_2O$, $Zr[OCH(CH_3)_2]_4$ and $Ti[OCH(CH_3)_2]_4$ added to the solution being calculated to produce the desired PZT composition (7.963 g, 1.310 g and 4.548 g, respectively).

Step 3. Precursor solution of $PbZr_{0.8}Ti_{0.2}O_3$ was first spin-coated onto a Pt-passivated silicon substrate at 3000 rpm for 30 seconds. The substrate surface is pre-coated with a thin layer of $SiO_2$ (about 100 mm in thickness), a thin Ti layer (about 50 nm in thickness) and a thin Pt layer (about 100 nm in thickness). The first precursor layer was dried at 300° C. for 5 minutes and then baked at 500° C. for 20 minutes.

Step 4. Precursor solution of $PbZr_{0.2}Ti_{0.8}O_3$ was then spin-coated on the first precursor layer, and dried and baked in similar manner as described in the last paragraph.

Step 5. The two-heterolayered precursor film was then annealed at 600° C. for 1.0 hour.

Figure 3:
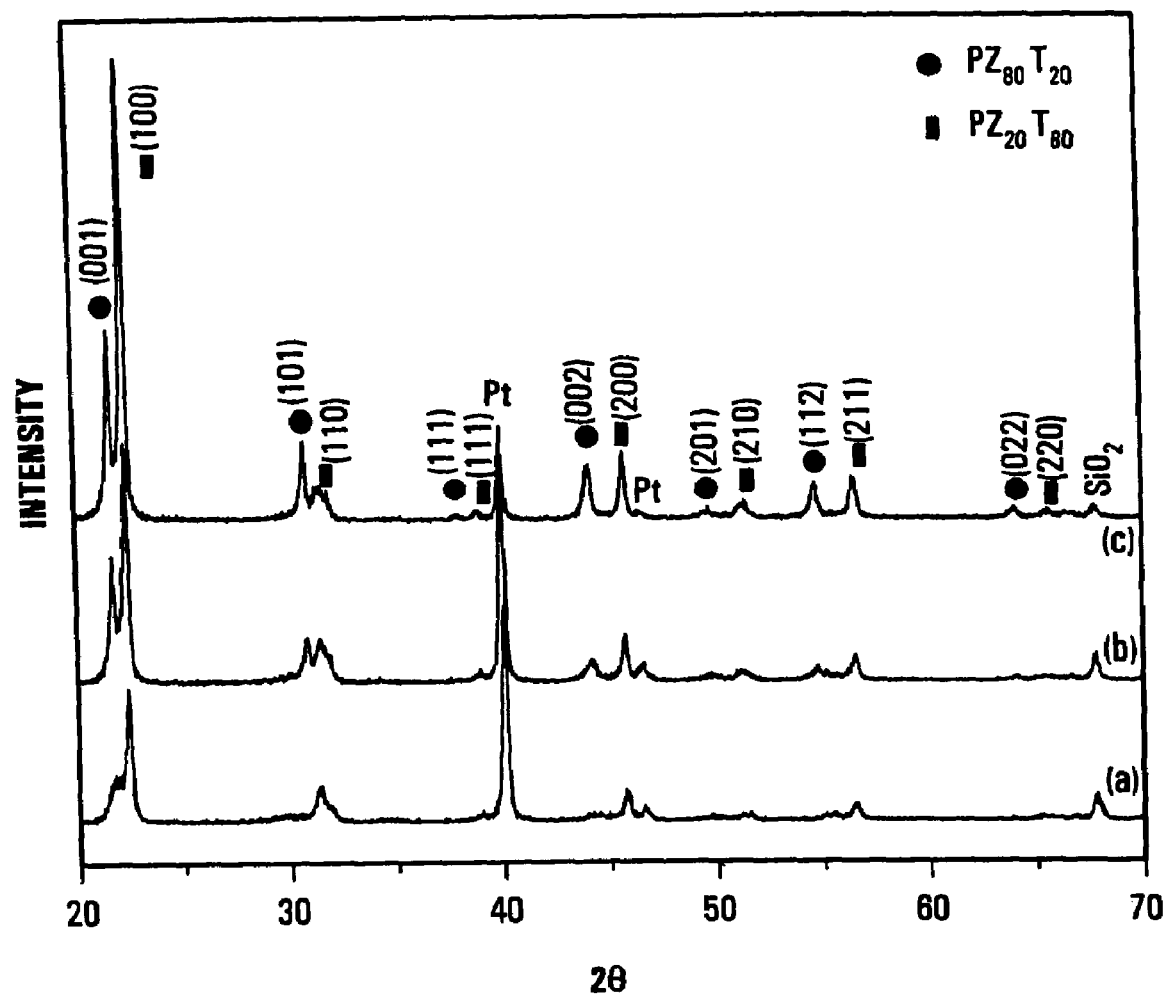
FIG. 3 shows X-ray diffraction traces for three different heterolayered PZT films, where (a) is for the heterolayered PZT thin film consisting of two alternating $PbZr_{0.8}Ti_{0.2}O_3$ and $PbZr_{0.2}Ti_{0.8}O_3$ layers prepared in accordance with Example 1 of the present invention; (b) is for the heterolayered PZT thin film consisting of four alternating $PbZr_{0.8}Ti_{0.2}O_3$ and $PbZr_{0.2}Ti_{0.8}O_3$ layers prepared in accordance with Example 2 of the present invention; (c) is for the heterolayered PZT thin film consisting of six alternating $PbZr_{0.8}Ti_{0.2}O_3$ and $PbZr_{0.2}Ti_{0.8}O_3$ layers prepared in accordance with Example 3 of the present invention.
Figure 4A:
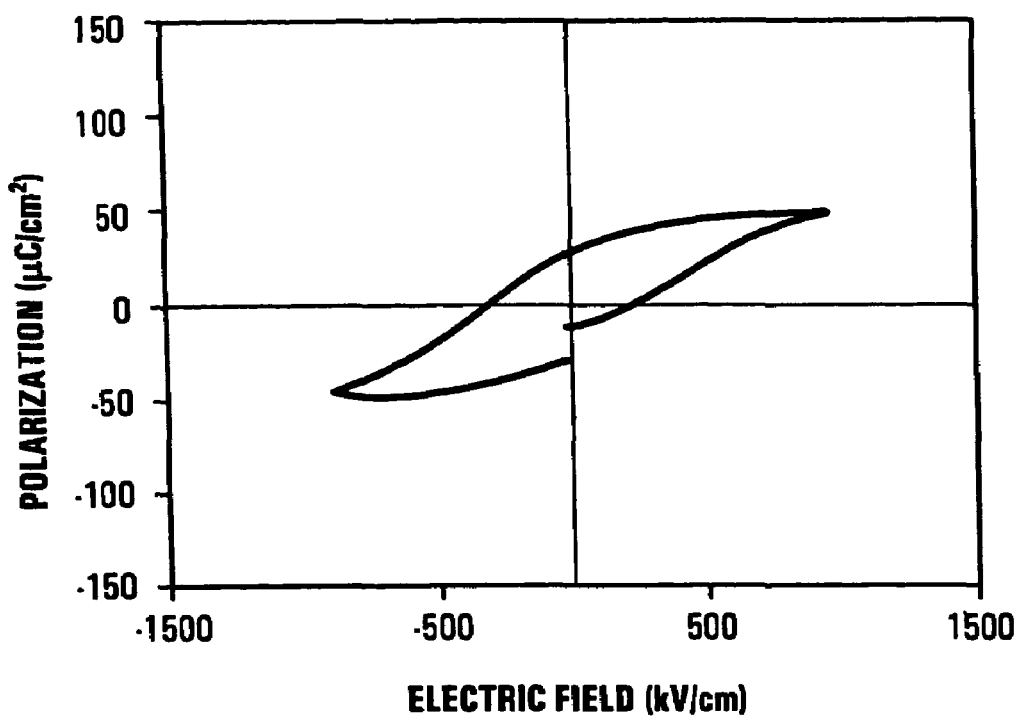
FIG. 4A to 4C show the ferroelectric hysteresis loops of the heterolayered PZT films of FIG. 3, respectively.

The resulting two-heterolayered PZT film exhibited a (100) preferred orientation, as demonstrated by the XRD trace labelled (a) in FIG. 3. As indicated by the hysteresis loop shown in FIG. 4A, the two-heterolayered film had a remanent polarization ($P_r$) of 28.3 $\mu C/cm^2$ and a coercivity field ($E_c$) of 277 kV/cm which was comparable to those of known polycrystalline PZT films. See for example, (1) C. H. Lin, P. A. Friddle, C. H. Ma, A. Daga, and H. Chen, Journal of Applied Physics, 90, 2001, p1509. (2) T. Kumazama, Y. Kumagai, H. Miura, and M. Kitano, Applied Physics Letters, 72, 1998, p608. (3) O. Lohse, M. Grossmann, U. Boettger, and D. Bolten, Journal of Applied Physics, 89, 2001, p2332.

Figure 5:
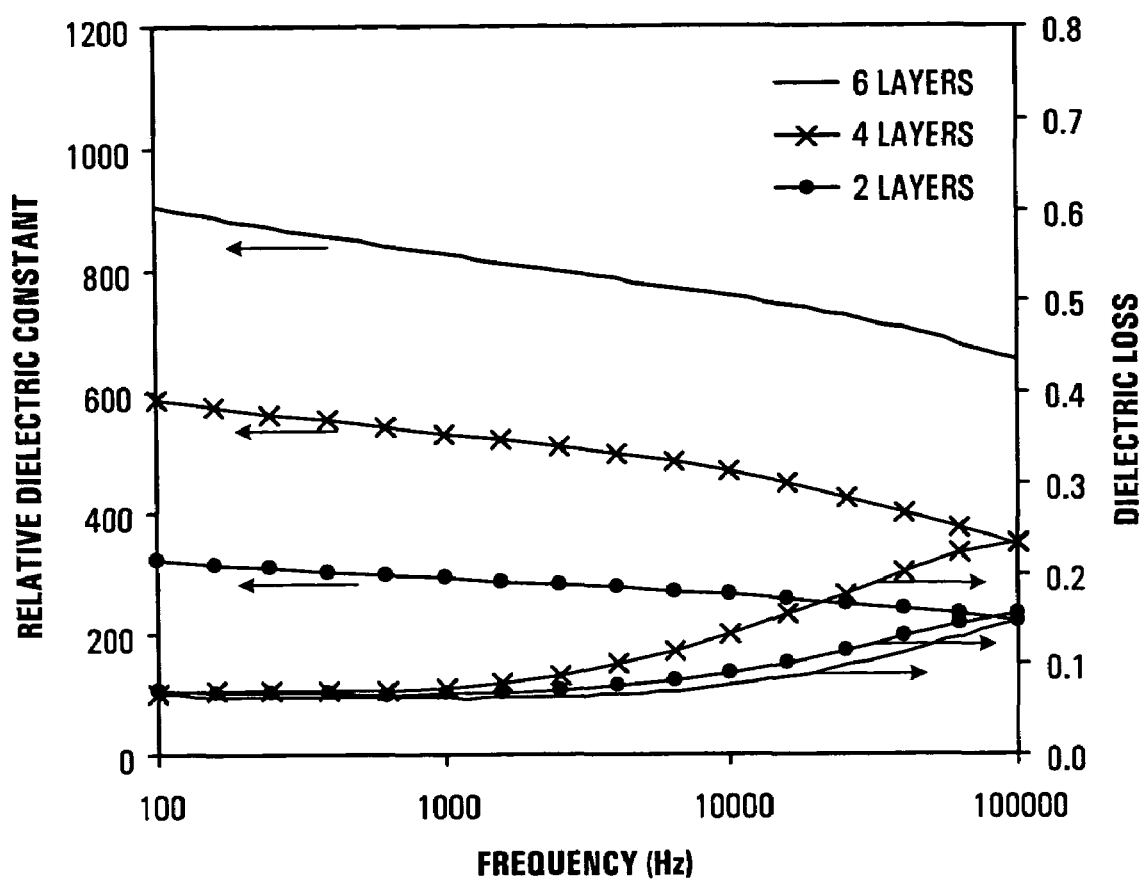
FIG. 5 shows the dielectric properties of the heterolayered PZT films of FIG. 3.

As shown in FIG. 5, the heterolayered PZT film had a dielectric constant varying between 322 and 220, over the frequency range of 100 Hz to 100 kHz.

EXAMPLE 2

A four-heterolayered PZT film was formed using a similar procedure as in Example 1 except that steps 3 and 4 were repeated one more time before step 5 so as to form four alternating layers of PZT compositions.

Figure 4B:
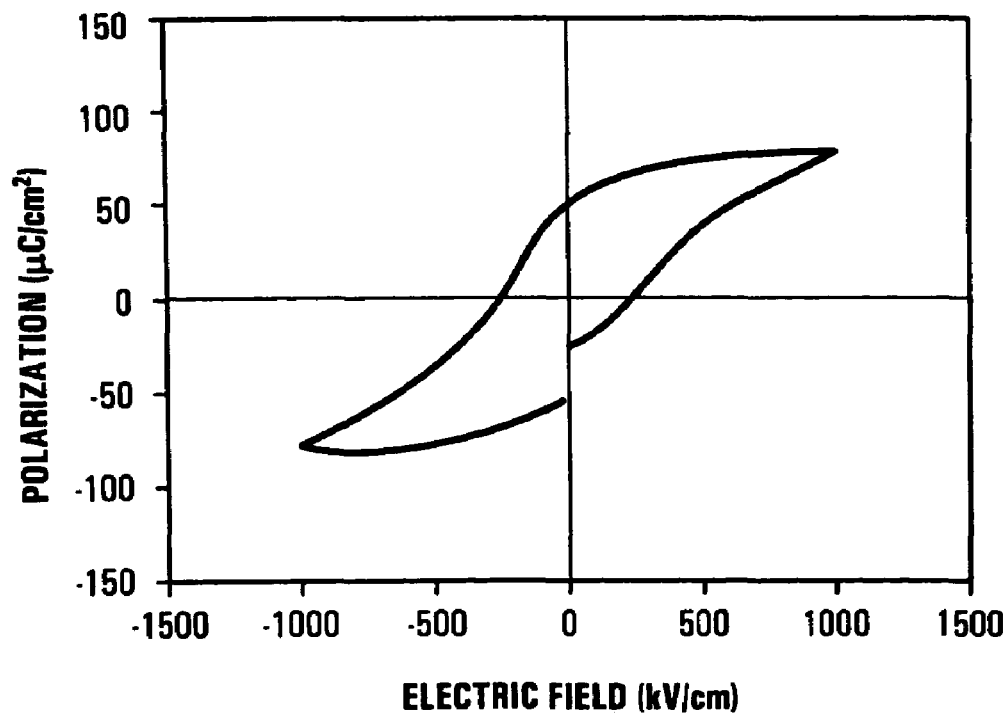

The resulting four-heterolayered film exhibited a (100) preferred orientation, as indicated by the XRD trace labelled (b) in FIG. 3, where the (100) peak was relatively stronger than that exhibited by the two-heterolayered film of Example 1. As indicated by the hysteresis loop shown in FIG. 4B, the four-heterolayered film had a $P_r=53.1$ $\mu C/cm^2$, which was higher than that of the two-heterolayered PZT thin film of Example 1, and a coercivity field ($E_c$) of 265 kV/cm, which was lower than that of the two-heterolayered film of Example 1. As shown in FIG. 5, the four-heterolayered film had a dielectric constant varying between 588 and 348, over the frequency range of 100 Hz to 100 kHz, which was higher than those of the two-heterolayered PZT film of Example 1.

EXAMPLE 3

A six-heterolayered PZT film was formed using a similar procedure as in Example 1 except that steps 3 and 4 were repeated two more times before step 5 so as to form six alternating layers of PZT compositions.

Figure 4C:
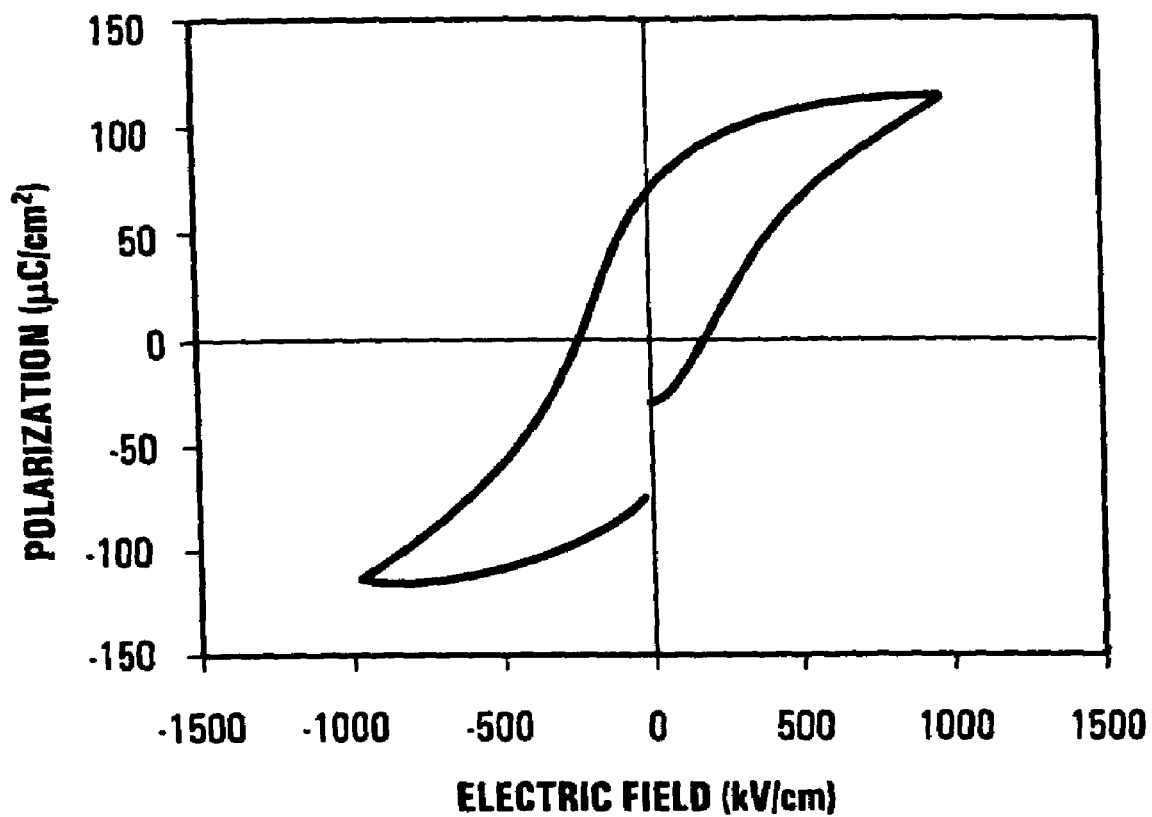
Figure 6:
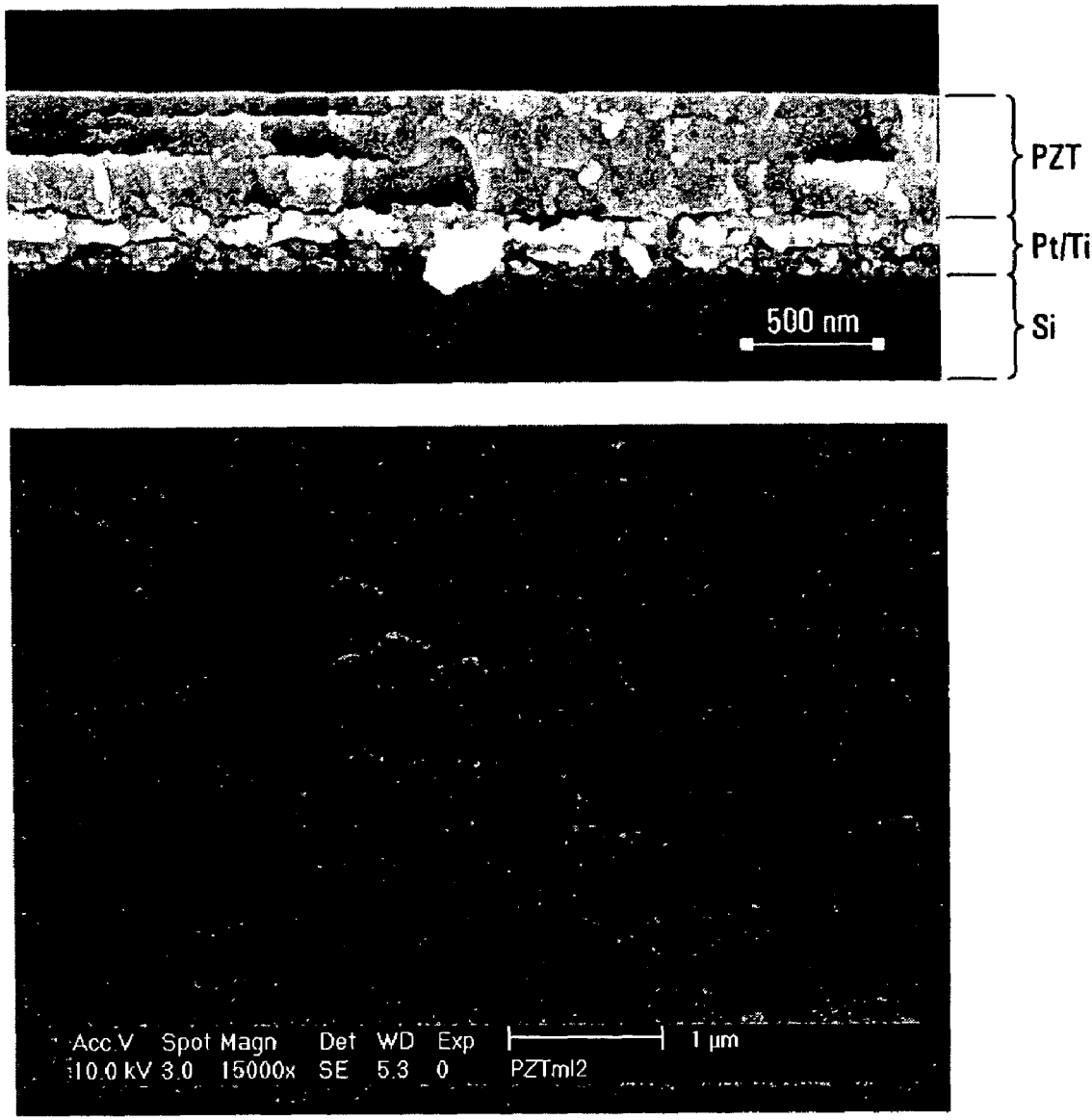
FIG. 6 is scanning electron microscope images taken from one of the heterolayered PZT films of FIG. 3, showing the cross section and surface texture of heterolayered PZT film consisting of six alternating layers of $PbZr_{0.8}Ti_{0.2}O_3$ and $PbZr_{0.2}Ti_{0.8}O_3$ prepared in accordance with Example 3 of the present invention.

The resulting six-heterolayered PZT film exhibited a (100) preferred orientation stronger than that exhibited by the four-heterolayered film of Example 2, as indicated by the XRD trace labelled (c) in FIG. 3. As indicated by the hysteresis loop of FIG. 4C, the six-heterolayered PZT film had a $P_r=71.9$ $\mu C/cm^2$, higher than the corresponding value of the four-heterolayered film of Example 2, and a coercivity field ($E_c$) of 223 kV/cm, lower than that of the four-heterolayered film of Example 2. As shown in FIG. 5, the six-heterolayered film had a dielectric constant varying between 905 and 652, over the frequency range of 100 Hz to 100 kHz measured at room temperature, which was higher than the corresponding value of the four-heterolayered PZT film of Example 2. Scanning electron microscope (SEM) images showing the cross section and surface texture of the six-heterolayered PZT film are shown in FIG. 6.

Figure 7:
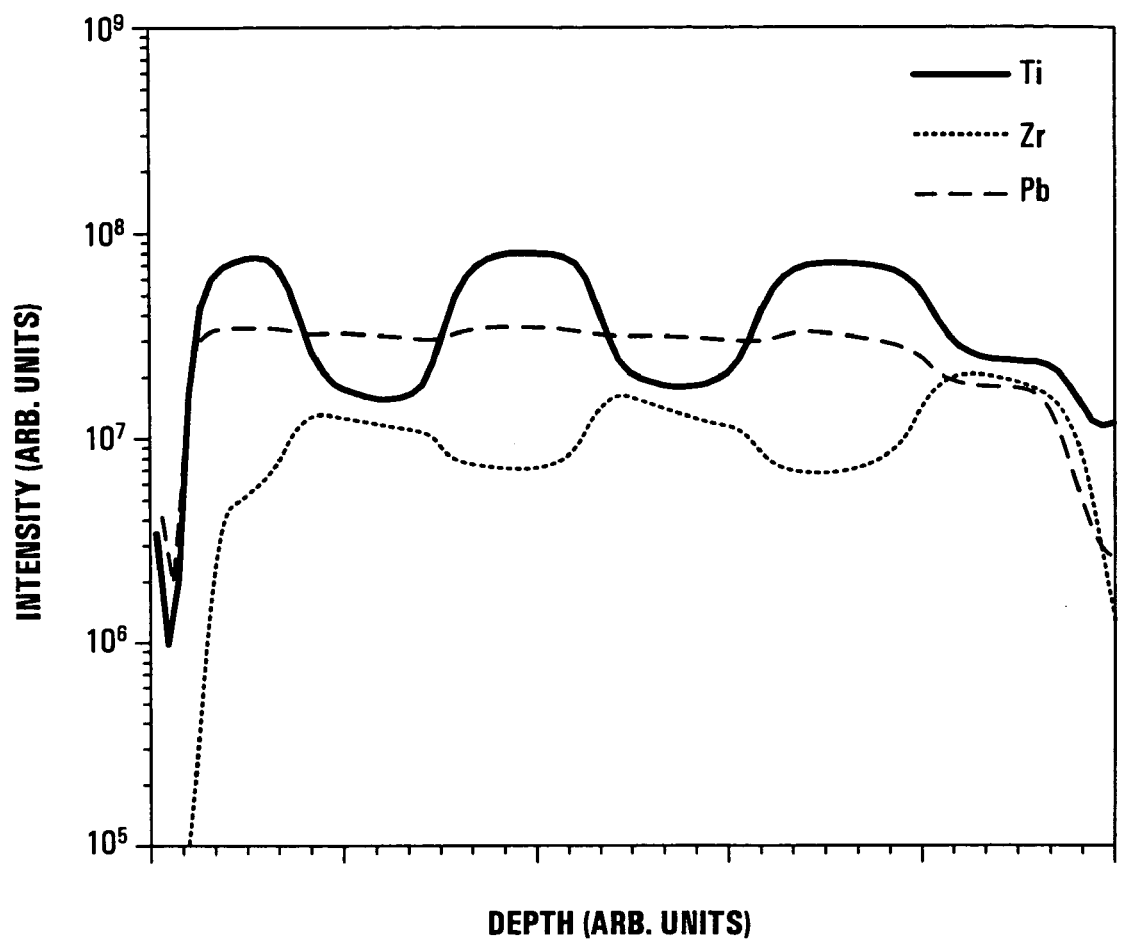
FIG. 7 shows the elemental depth profile of the six-heterolayered PZT film of FIG. 6.

FIG. 7 shows an elemental depth profile of the six-heterolayered PZT film, measured by a secondary ion mass spectrometer.

These results indicate that the six-heterolayered PZT film has well defined alternating layers of $PbZr_{0.8}Ti_{0.2}O_3$ and $PbZr_{0.2}Ti_{0.8}O_3$. As can be seen, $PbZr_{0.8}Ti_{0.2}O_3$ and $PbZr_{0.2}Ti_{0.8}O_3$ layers appear at rather discrete depths and there is little depletion from each other. The total thickness of the imaged six-heterolayered PZT film was about 500 nm, which was confirmed using a film thickness measurement system. As can be seen, each of the alternating $PbZr_{0.8}Ti_{0.2}O_3$ and $PbZr_{0.2}Ti_{0.8}O_3$ layers is relatively dense, with no apparent pores being present at the grain boundaries and junctions. As can be appreciated by persons skilled in the art, this indicates a high sintered density of the film, which is desirable for ferroelectric/piezoelectric thin films. Generally, the higher the sintered density, the better the dielectric and ferroelectric properties of the film.

EXAMPLE 4

A six-multilayered PZT film was prepared using a similar procedure as in Example 3, except that only one PZT precursor solution, with a $PbZr_{0.8}Ti_{0.2}O_3$ composition, was prepared and used, instead of using two different precursor solutions. Therefore, the resulting film has a six-multilayered structure, each layer having a $PbZr_{0.8}Ti_{0.2}O_3$ composition.

Figure 8A:
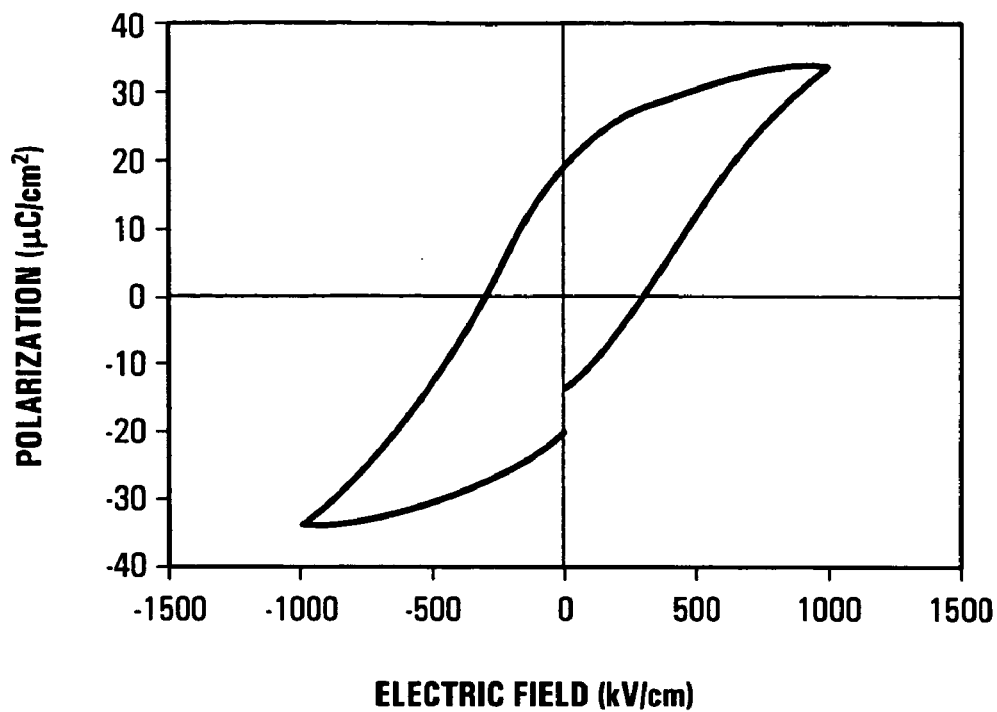
FIGS. 8A and 8B show the ferroelectric hysteresis loops of two multilayered PZT films, where (A) is hysteresis loop for the multilayered PZT thin films consisting of six layers of $PbZr_{0.8}Ti_{0.2}O_3$, prepared in accordance with Example 4 of the present invention; and (B) is hysteresis loop for the multilayered PZT thin films consisting of six layers of $PbZr_{0.2}Ti_{0.8}O_3$, prepared in accordance with Example 5 of the present invention.

The resulting six-multilayered PZT film exhibits much lower preferred orientation. For the six-multilayered PZT thin film, $P_r=19.8$ $\mu C/cm^2$, as indicated in FIG. 8A, which is much lower than that of the six-heterolayered PZT film of Example 3.

EXAMPLE 5

A six-multilayered PZT film was prepared using a similar procedure as in Example 4, except that the PZT precursor solution had a $PbZr_{0.2}Ti_{0.8}O_3$ composition, instead of $PbZr_{0.8}Ti_{0.2}O_3$. Therefore, the resulting six-multilayered PZT film had six layers of $PbZr_{0.2}Ti_{0.8}O_3$.

Figure 8B:
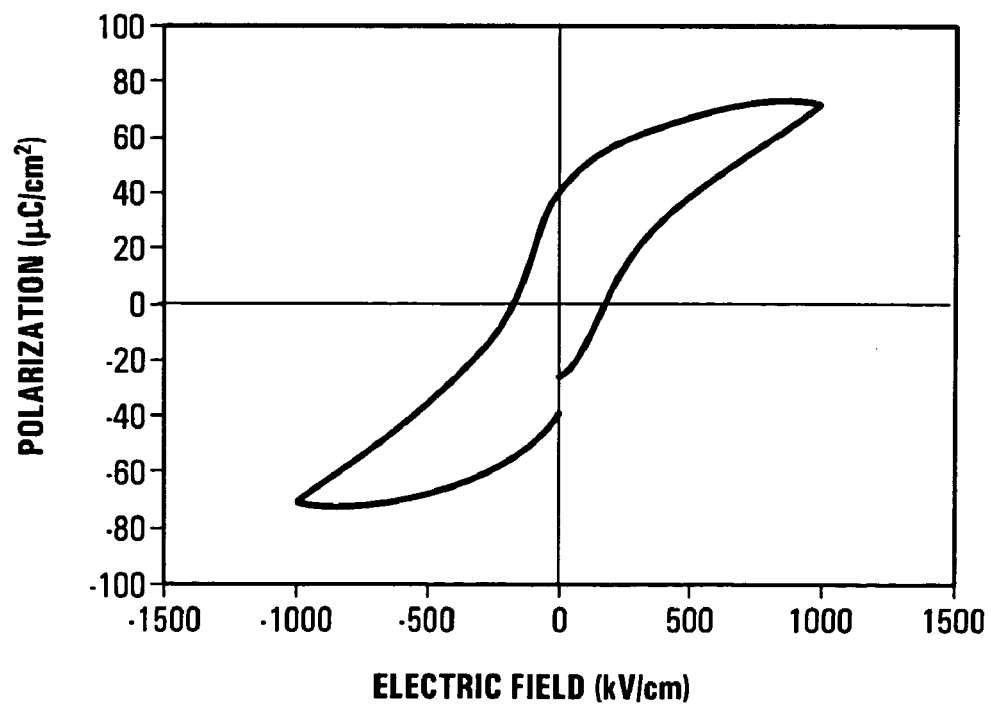

The resulting six-multilayered PZT film exhibited a small degree of (100) preferred orientation, stronger than the six-layered PZT film of Example 4 but still much weaker than the six-heterolayered PZT film of Example 3. As indicated in FIG. 8B, for the six-multilayered film of Example 5, $P_r=40.3$ $\mu C/cm^2$, which is much lower than that of the six-heterolayered PZT film of Example 3.

As can be appreciated by a person skilled in the art, the diffraction peaks of XRD traces shown in from FIG. 3 demonstrate that $PbZr_{0.8}Ti_{0.2}O_3$ and $PbZr_{0.2}Ti_{0.8}O_3$ phases co-exist in the heterolayered films of Examples 1 to 3. While the $PbZr_{0.2}Ti_{0.8}O_3$ phase exhibited a tetragonal structure, the $PbZr_{0.8}Ti_{0.2}O_3$ phase exhibited a rhombohedral structure. In all three heterolayered thin films, a preferred orientation was indicated by the strong (100) peaks. The degree of preferred orientation became stronger with increasing number of alternating layers.

As illustrated in FIGS. 4A to 4C and 5, the ferroelectric and dielectric properties of the heterolayered thin films are dependent on the number of alternating layers in the film. As the number of alternating layers increases, the values of $P_r$ and the dielectric constant increase but the value of $E_c$ decreases.

As shown in FIG. 5, the dielectric constant not only increases with the number of alternating layers in the heterolayered PZT films but also decreases with increasing frequency. For example, the dielectric constant is 905, 588 and 322 for the heterolayered films having six, four and two alternating layers respectively at 100 Hz, but gradually decreases to 652, 348 and 220 at 100 kHz. These values of dielectric constant are higher than those of the conventional polycrystalline PZT thin films. See for example. (1) Y. Sakashita, T. Ono, H. Segawa, K. Tominaga, and M. Okada, Journal of Applied Physics, 69, 1991, p8352. (2) I. Kanno, S. Hayashi, R. Takayama, and T. Hirao, Applied Physics Letters, 68, 1996, p328; (3) Q. Zou, H. E. Ruda, and B. G. Yacobi, Applied Physics Letters, 78, 2001, p1282). (4) Z. Qin, Y. Ben, R. H. Eugen, and F. Mark, International Patent, WO 01/67465 A2,13 Sep. 2001.

The measured dielectric loss for the heterolayered PZT films was about 0.07, which increased slightly with increasing frequency. The low dielectric loss indicates that the high dielectric constant values correctly reflect the true dielectric response of the films, rather than as a result of other influencing factors, such as space charge.

FIGS. 8A and 8B show hysteresis loops for the multilayered PZT films of Example 4 and 5 respectively. The six-multilayered PZT films exhibited much lower values of PZT than that of the six-heterolayered PZT film of Example 3, demonstrating a fundamental difference between the multilayered PZT films, such as those of Example 4 and 5, and the heterolayered PZT films, such as that of Example 2 and 3. As can be understood, in a conventional PbZr$_{0.2}$Ti$_{0.8}$O$_3$ with (100) orientation, the value of P$_r$ would be expected to be low because the polarization direction of the tetragonal structure of the PZT is along the c-axis, i.e., in parallel to the film surface. In contrast, the values of P$_r$ in the heterolayered PZT films with a (100) preferred orientation can be much higher in comparison to a conventional polycrystalline PZT film with or without preferred orientation.

Other features, benefits and advantages of the present invention not expressly mentioned above can be understood from this description and the accompanying drawings by those skilled in the art.

The heterolayered PZT thin films and the processes for forming them described herein are all exemplary embodiments of one or more aspects of the invention. As can be understood by a person skilled in the art, many modifications to these exemplary embodiments are possible. For example, process S20 can be readily modified by persons skilled in art for forming non-PZT heterolayered thin films. The invention, rather, is intended to encompass all such modification within its scope, as defined by the claims.

All documents referred to herein are fully incorporated by reference.

What is claimed is:

1. A method of forming a heterolayered thin film, comprising:
    (a) forming a first precursor layer capable of being crystallized into a rhombohedral structure of a first ferroelectric/piezoelectric material;
    (b) baking said first precursor layer without crystallizing said first precursor layer;
    (c) forming a second precursor layer capable of being crystallized into a tetragonal structure of a second ferroelectric/piezoelectric material on said first precursor layer;
    (d) baking said second precursor layer at a temperature for a period of time sufficient to crystallize said second precursor layer without crystallizing said first precursor layer;
    (e) after said second precursor layer is crystallized, annealing said first and second precursor layers, thus crystallizing said first precursor layer and forming a crystallized thin film that comprises
        a first ferroelectric/piezoelectric layer having a rhombohedral crystal structure, and
        a second ferroelectric/piezoelectric layer on said first ferroelectric/piezoelectric layer and having a tetragonal crystal structure,
        said first and second ferroelectric/piezoelectric layers having a (100) preferred orientation with α-axis normal to a surface of said thin film.

2. The method of claim 1 comprising repeating steps (a) to (d) prior to annealing, to form a heterolayered thin film comprising more than three layers of alternating crystal structures.

3. A method of forming a heterolayered lead ziroconate titanate (PZT) film, comprising:
    (a) forming a first precursor layer containing PZT having a chemical formula of PbZr$_x$Ti$_{(1-x)}$O$_3$, wherein 0.52<x<0.9;
    (b) baking said first precursor layer without crystallizing said first precursor layer;
    (c) forming on said first precursor layer, a second precursor layer containing PZT having a chemical formula of PbZr$_y$Ti$_{(1-y)}$O$_3$, wherein 0<y<0.52;
    (d) baking said second precursor layer at a temperature for a period of time sufficient to crystallize said second precursor layer without crystallizing said first precursor layer; and
    (e) after said second precursor layer is crystallized, annealing said first and second precursor layers, thus crystallizing said first precursor layer and forming a crystallized film that comprises
        a first PZT layer having a rhombohedral crystal structure, and
        a second PZT layer on said first PZT layer and having a tetragonal crystal structure,
        said first and second PZT layers having a (100) preferred orientation with α-axis normal to a surface of said film.

4. The method of claim 3 wherein forming said first precursor layer comprises coating a first precursor solution of PZT on a substrate and drying said precursor layer.

5. The method of claim 4 wherein forming said second precursor layer comprises coating a second precursor solution of PZT on the first precursor layer and drying said second precursor layer.

6. The method of claim 5 further comprising repeating the steps of (a) to (d) to form alternating first and second layers wherein step(a) when repeated is modified by coating the first precursor solution of PZT on the second precursor layer.

7. The method of claim 6 wherein x is 0.8 and y is 0.2.

8. The method of claim 7 wherein drying comprises heating to a temperature between about 250° C. and about 350° C. for about 5 to 20 minutes.

9. The method of claim 8 wherein baking comprises heating to a temperature of about 480° to 510° C.

10. The method of claim 9 wherein baking comprises heating to a temperature of about 500° C. for about 10 to 30 minutes.

11. The method of claim 10 wherein said annealing comprises heating to a temperature between about 600° C. and about 750° C. for about 0.5 to 2 hours.

12. The method of claim 11 wherein said first and second precursor solutions are sol solutions.

13. The method of claim 12 wherein steps (a) and (c) further comprises preparing said sol solutions.

14. The method of claim 13 wherein said preparing comprises mixing a lead precursor, a zirconium precursor, and a titanium precursor.

15. The method of claim 14 wherein said lead precursor is lead acetate, said zirconium precursor is zirconium propoxide, and said titanium precursor is titanium isopropoxide.

16. The method of claim 15 wherein the solvent of said sol solution is acetic acid and ethylene glycol monomethyl ether.

17. The method of claim 16 wherein the volume ratio of ethylene glycol monomethyl ether and acetic acid in said sol solution is in the range of 2 to 6.

18. The method of claim 17 comprising adding an amount of lead in said sol solution in excess, by up to about 10 mol %, of an amount calculated from the desired chemical composition of a PZT layer to be formed by said sol solution.

19. The method of claim 18 wherein said coating comprises spin-coating.

20. The method of claim 19 wherein said spin-coating is performed at a speed of about 2000 to 5000 rpm for about 20 to 50 seconds.

21. The method of claim 20 wherein said substrate is a Pt-passivated silicon wafer.

22. The method of claim 21 wherein said steps (a) to (d) are repeated twice.

23. The method of claim 21 wherein said steps (a) to (d) are repeated three times.

24. The method of claim 21 wherein said steps (a) to (d) are repeated more than three times.

* * * * *